US007825424B2

(12) United States Patent
Bristol et al.

(10) Patent No.: US 7,825,424 B2
(45) Date of Patent: Nov. 2, 2010

(54) METHODS TO MANUFACTURE CONTAMINANT-GETTERING MATERIALS IN THE SURFACE OF EUV OPTICS

(75) Inventors: Robert L. Bristol, Portland, OR (US); Bruce H. Billett, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 266 days.

(21) Appl. No.: 12/002,152

(22) Filed: Dec. 14, 2007

(65) Prior Publication Data

US 2008/0158662 A1 Jul. 3, 2008

Related U.S. Application Data

(62) Division of application No. 11/092,167, filed on Mar. 28, 2005, now Pat. No. 7,332,416.

(51) Int. Cl.
*H01L 29/26* (2006.01)

(52) U.S. Cl. ............................ 257/98; 257/80; 257/88; 257/91; 257/431; 257/432; 257/435; 257/E23.137; 257/E31.127

(58) Field of Classification Search .................. 257/80, 257/88, 91, 98, 431, 432, 435, E23.137, E31.127
See application file for complete search history.

(56) References Cited

U.S. PATENT DOCUMENTS

| | | | | |
|---|---|---|---|---|
| 6,252,294 | B1 | 6/2001 | Hattori et al. | |
| 6,812,636 | B2 | 11/2004 | Porter et al. | |
| 2002/0067126 | A1 | 6/2002 | Van Den Reek et al. | |
| 2002/0167262 | A1* | 11/2002 | Porter et al. | 313/483 |
| 2004/0079902 | A1 | 4/2004 | Bristol | |
| 2004/0232517 | A1* | 11/2004 | Furuhata | 257/520 |
| 2005/0016679 | A1 | 1/2005 | Ruzie et al. | |
| 2006/0163711 | A1 | 7/2006 | Roels | |

* cited by examiner

*Primary Examiner*—Kevin M Picardat
*Assistant Examiner*—Bac H Au
(74) *Attorney, Agent, or Firm*—Blakely, Sokoloff, Taylor & Zafman LLP

(57) ABSTRACT

Methods to manufacture contaminant-gettering materials in the surface of EUV optics are described herein. An optical element is patterned and a contaminant-gettering material is formed on a surface of the optical element. In one embodiment, a photoresist is deposited on an optical coating on the optical element. Trenches are formed in the optical coating. The gettering agent is formed into the trenches over the photoresist. Next, the photoresist is removed from the optical coating to expose the gettering agent in the trenches. For another embodiment, patches of a nanotube forest having a gettering agent are formed in designated areas of an optical element. The gettering agent of the patches may be a plurality of carbon nanotubes. The optical coating is formed on a substrate between patches of the gettering agent.

8 Claims, 9 Drawing Sheets

METHODS TO MANUFACTURE CONTAMINANT-GETTERING MATERIALS IN THE SURFACE OF EUV OPTICS

CROSS-REFERENCE TO RELATED APPLICATION

This patent application is a divisional application of U.S. patent application Ser. No. 11/092,167 filed on Mar. 28, 2005 entitled "METHODS TO MANUFACTURE CONTAMINANT-GETTERING MATERIALS IN THE SURFACE OF EUV OPTICS", which issued as U.S. Pat. No. 7,332,416 on Feb. 19, 2008, and claims a priority benefit thereof.

FIELD

Embodiments of the invention relate generally to the field of extreme ultra-violet ("EUV") optics manufacturing, and more specifically, to manufacturing the contaminant-gettering materials in the EUV optical elements.

BACKGROUND

To print ever smaller features of the patterns defining integrated circuits onto semiconductor wafers, the wavelength of the light to project image of a pattern onto the wafer is continuously reduced. Extreme Ultraviolet lithography ("EUVL") is one of the lithography technologies, which employs short wavelength radiation ("light") in the approximate range of 10 nanometers ("nm") to 20 nm enabling to print features having a size below 100 nm. Because extreme ultraviolet ("EUV") radiation is absorbed in almost all materials, the optics utilized in EUVL systems is reflective.

Typically, to produce EUV photons plasma is created in a source of EUV radiation containing a fuel material. The plasma is created through an electrical discharge or by a laser. EUV photons are produced by radiation of the charged atoms of the plasma. An amount of produced EUV photons depends on a conversion efficiency of the fuel material. The conversion efficiency indicates how much input energy is needed to produce a EUV photon and is defined as a ratio of output EUV power to the input power. Typically, a xenon gas having a conversion efficiency of 1% is used to produce EUV photons.

Lithium ("Li") or tin ("Sn") has approximately 2 to 4 times higher conversion efficiency over the xenon gas to produce EUV photons. In other words, lithium or tin may make several times more EUV light than xenon for the same input energy.

Lithium or tin, however, are reactive materials and tend to chemically attack all nearby surfaces, and in particular, the fragile EUV collector optics. The lithium or tin atoms in the plasma are evaporated as the plasma heats up. The lithium or tin atoms tend to condense on the surface of the optics making EUV optics inoperable. For example, Li or Sn buildups having a thickness of about 10 nanometers ("nm") reduce the reflectivity of the reflective surface of the optics down to zero.

Maintaining the EUV optics at elevated temperatures to keep the evaporation rate of the Li or Sn atoms at the same level as the condensation rate does not remove contaminants from the optics, because at elevated temperatures, the Li or Sn atoms start to diffuse into the material of the optics. Diffusion of lithium or tin atoms into the optical material destroys optical coating of the EUV optics that makes EUV optics inoperable.

BRIEF DESCRIPTION OF THE DRAWINGS

The present invention is illustrated by way of example and not limitation in the figures of the accompanying drawings, in which like references indicate similar elements, in which.

DETAILED DESCRIPTION

Figure 1:
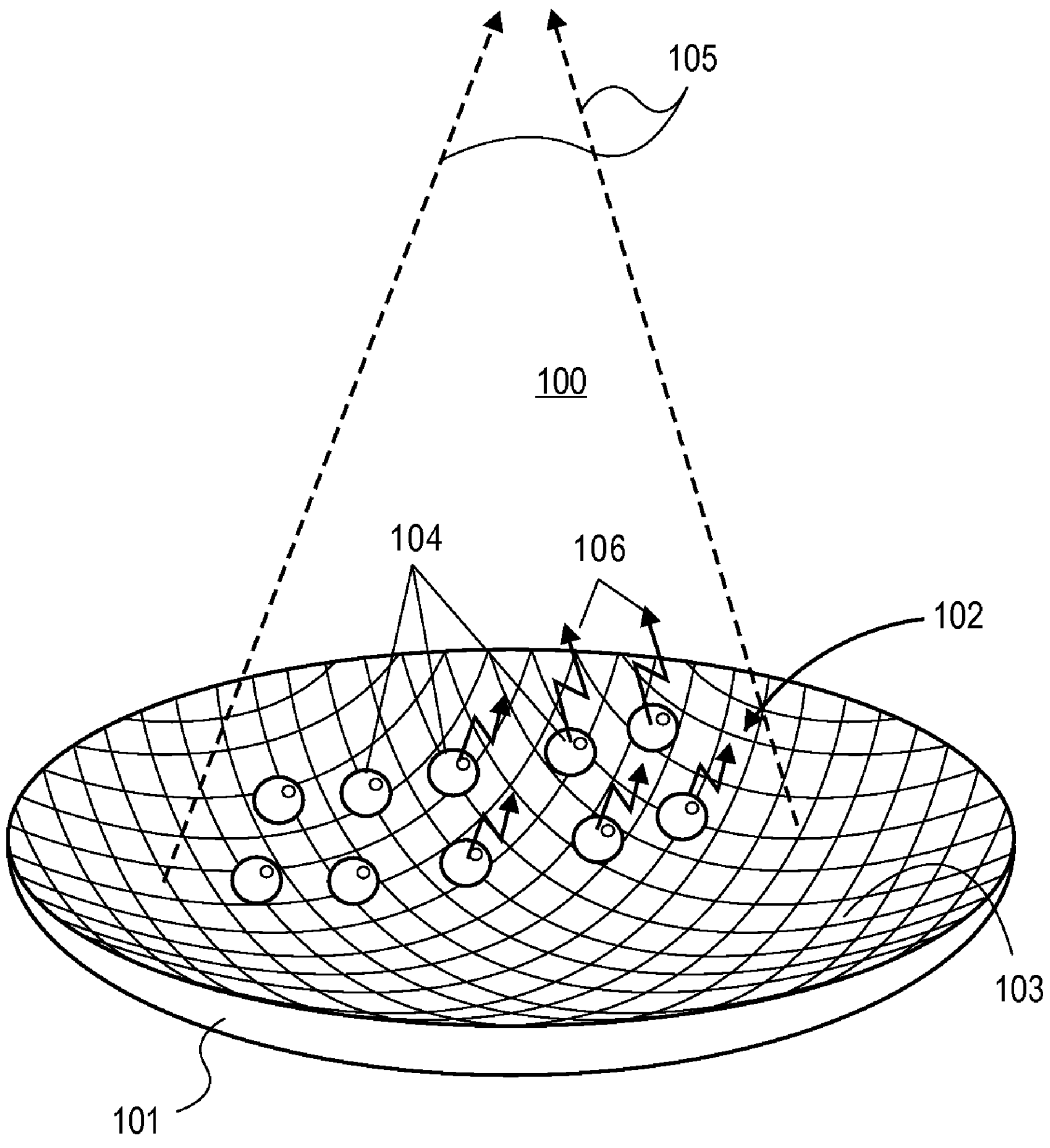
FIG. 1 is a perspective view of one embodiment of an optical element for EUV light.

In the following description, numerous specific details, such as specific materials, dimensions of the elements, etc. are set forth in order to provide thorough understanding of one or more of the embodiments of the present invention. It will be apparent, however, to one of ordinary skill in the art that the one or more embodiments of the present invention may be practiced without these specific details. In other instances, semiconductor fabrication processes, techniques, materials, equipment, etc., have not been described in great details to avoid unnecessarily obscuring of this description.

Those of ordinary skill in the art, with the included description, will be able to implement appropriate functionality without undue experimentation.

While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment of the present invention. Thus, the appearance of the phrases "In one embodiment" or "for an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment of this invention. While the invention has been described in terms of several embodiments, those skilled in the art will recognize that the invention is not limited to the embodiments described, but can be practiced with modification and alteration within the spirit and scope of the appended claims. The description is thus to be regarded as illustrative rather than limiting.

Methods to manufacture contaminant-gettering materials on the surface of the extreme ultra-violet ("EUV") optical elements are described herein. An optical element is patterned and a contaminant-gettering material ("gettering agent") is formed on a surface of the optical element. The gettering agent prevents a contaminant material from accumulating on an optical surface of the optical element. The gettering agent has substantially high diffusion properties for contaminants and acts as a "sponge" to draw the contaminants away from the optical surface of the optical element. In one embodiment, a photoresist is formed on an optical coating on the optical element, and then channels ("trenches") are formed in the optical coating. Next, the gettering agent is deposited into the trenches over the photoresist. The photoresist is then removed from the optical coating to expose the gettering agent in the trenches. For another embodiment, patches of a nanotube forest having a gettering agent are formed on a surface of an optical element. An optical coating is then formed on the optical element over the patches of the nanotube forest. Next, the optical coating is removed from a portion of the surface of the optical element to expose patches of the nanotube forest containing the gettering agent. The gettering agent of the nanotube forest may be a plurality of carbon nanotubes.

FIG. 1 is a perspective view 100 of one embodiment of an optical element 101 for EUV light. In an embodiment, optical element 101 for EUV light may be any of source optics, collector optics, projection optics, illumination optics, condenser optics, or a mask. More specifically, optical element 101 may be EUV source collector optics. As shown in FIG. 1, optical element 101 has a concave shape of a macroscopic curved mirror to optimize the light collection efficiency and to minimize scattering of the light. In one embodiment, optical element 101 shown in FIG. 1 may have a quasi-hemispherical shape, for example, a hemisphere having a semi-parabolic or elliptical shape to effectively collect light radiating from plasma 104 in all directions. For another embodiment, optical element 101 may have a shape of nested grazing-incidence shells. The optical element 101, which surrounds plasma 104 generating optical photons 106, focuses light into a beam 105 and directs beam 105 to the other portions of a lithography tool to project image of a pattern onto a wafer. In one embodiment, the shape and the diameter of the optical element 101 are such to minimize loss of optical photons 106 generated from plasma 104. In one embodiment, optical element 101 has the diameter of at least 100 millimeters ("mm"). Dimensions and materials for optical element 101 are described in further details below with respect to FIGS. 3 and 4.

A surface 103 of the mirror of optical element 101 is machined with a grid 102 of trenches filled ("impregnated") with a gettering agent. Such trenches serve to diffuse contaminants away from the reflecting surface 103 of optical element 101. The gettering agent filling the trenches on the grid 102 acts like a sponge for atoms and molecules of contaminant materials, preserving the reflectivity of optical element 101. The width of the trenches and a distance between each of the trenches on the grid 102 are such to provide optimum functionality for a mirror of the optical element 101. More specifically, the reflectivity of the mirror of the optical element 101 with trenches is reduced by not more than 10% relative to the reflectivity of the mirror without the trenches. Dimensions of the trenches, gettering materials in the trenches, and contaminants for optical element 101 are described in further details below with respect to FIGS. 3 and 4.

Figure 2:
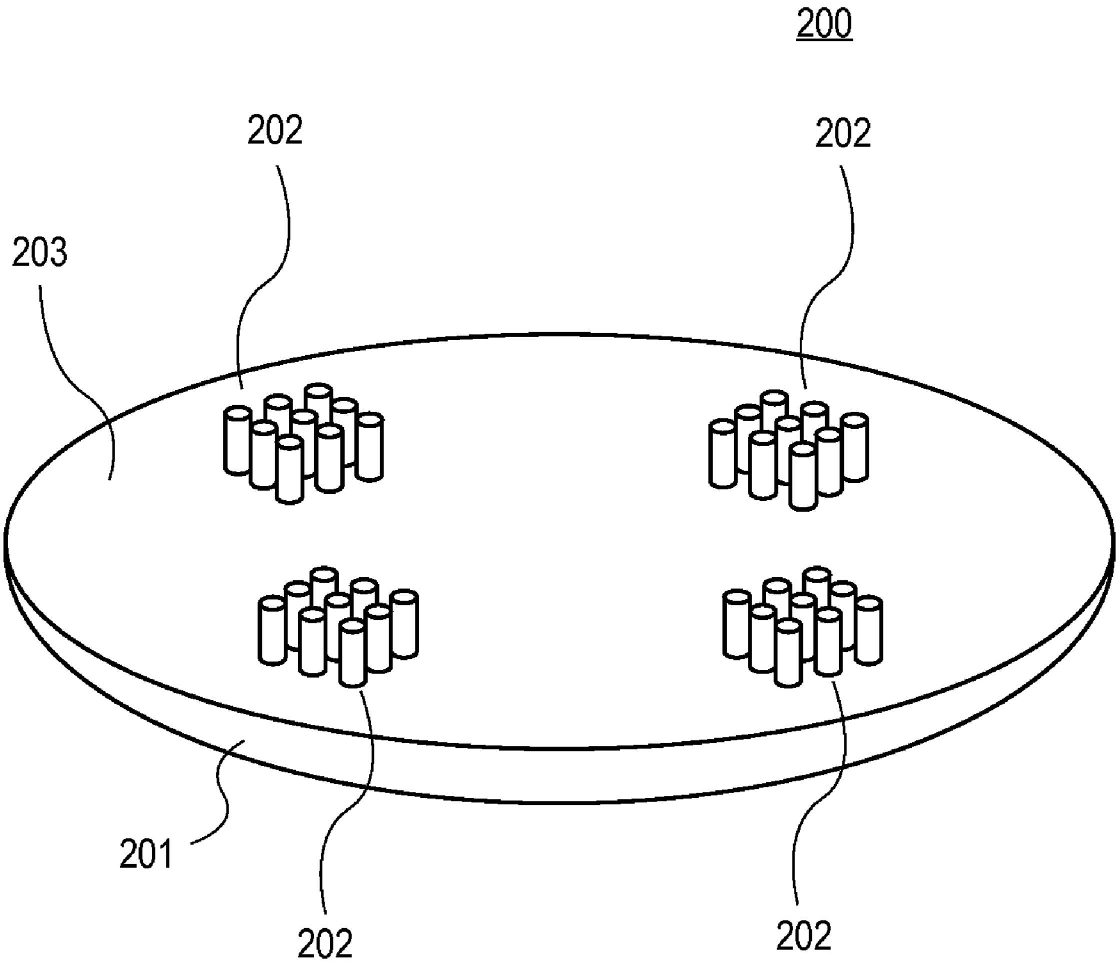
FIG. 2 is a perspective view of another embodiment of an optical element for EUV light.

FIG. 2 is a perspective view 200 of another embodiment of an optical element 201 for EUV light. Patches 202 of a gettering agent are deposited in designated areas on a surface of optical element 201, as shown in FIG. 2. In one embodiment, a shape of optical element 201 may be similar to the shape described above with respect to FIG. 1. Optical coating 203 is between patches 202 of the optical forest. Dimensions of patches 202 and an amount of patches 202 are such to provide optimum functionality for a mirror of optical element 201. In particular, the dimensions of patches 202 and the amount of patches 202 are such that optical interference of the light reflected from the optical coating 203 is minimized. Dimensions of patches 202, materials for the gettering agents, and materials for optical element 201 are described in further details below with respect to FIGS. 5 and 6.

Figure 3A:
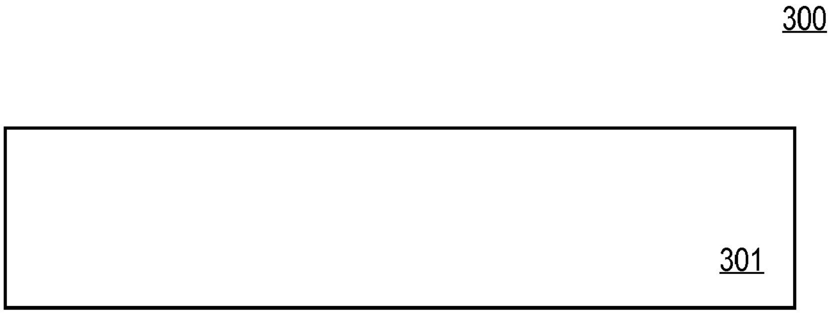
FIG. 3A is a cross-sectional view of a substrate to fabricate an optical element for EUV light according to one embodiment of the invention.

FIG. 3A is a cross-sectional view 300 of a substrate 301 to fabricate an optical element for EUV light according to one embodiment of the invention. In one embodiment, substrate 301 for the optical element for EUV light is made of a low thermal expansion ("LTEM") material, for example, a titanium silicate glass. In one embodiment, substrate 301 is an Ultra Low Expansion ("ULE®") glass substrate produced by Corning, Inc, located in Corning, N.Y. In one embodiment, substrate 301 for an optical element is made of glass, quartz, or any combinations thereof. In one embodiment, a diameter of substrate 301 is at least 100 mm. More specifically, the diameter of substrate 301 may be in the approximate range of 100 mm to 500 mm.

Figure 3B:
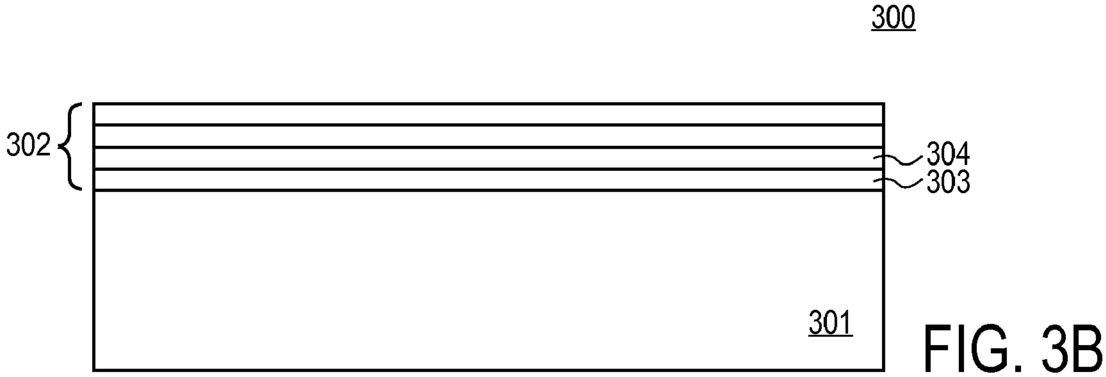
FIG. 3B is a view similar to FIG. 3A, after forming an optical coating on a substrate.

FIG. 3B is a view similar to FIG. 3A, after forming an optical coating 302 on substrate 301. In one embodiment, optical coating 302 on substrate 301 is a mirror, which reflects EUV light in the approximate wavelength range of 10 nm to 20 nm with reflectivity at least 65-70%. In an embodiment, optical coating 302 may include a metal, silicon, or any combination thereof. In an embodiment, the thickness of optical coating 302 is below one micron. In one embodiment, optical coating 302 includes alternating layers of two materials, wherein a difference of indexes of refraction between the two materials is substantially large to provide substantially high reflection of the EUVL light. In an embodiment, optical coating 302 may include a layer 303 of a high index of refraction material, for example, molybdenum ("Mo") and a layer 304 of a low index of refraction material, for example, silicon ("Si"). The thickness of each pair of alternating layers of the optical coating 302 satisfies the modified Bragg's law for a distributed Bragg reflector. In one embodiment, 40 pairs of layers 303 and 304 are deposited on substrate 301, wherein each of layers 303 and 304 has a thickness of about a quarter wavelength of a EUV photon. In one embodiment, optical coating 302 may have a layer of Mo having the thickness in the approximate range of 2 nm to 5 nm, and the layer of Si having the thickness in the approximate range of 2 nm to 5 nm. In one embodiment, the optical coating 302 including alternating layers of Mo and Si of the thickness in the approximate range of 2 nm to 5 nm may have a combined thickness in the approximate range of 260 nm to 320 nm. In one embodiment, optical coating 302 having layers 303 of Mo and 304 of Si may be formed using one of techniques well known to one of ordinary skill in the art of EUVL optics fabrication, for example using ion beam deposition, PVD, DC magnetron sputtering, or any combination thereof. In one embodiment, the substrate 301 coated with the optical coating 302 has a concave shape, e.g., a hemisphere shape, as described above with respect to FIG. 1. In another embodiment, for optical element having a shape of nested grazing-incidence shells, optical coating 302 to reflect light may include ruthenium ("Ru"), palladium ("Pd"), or any combination thereof. In one embodiment, substrate 301 coated with optical coating 302 that has a concave shape may be placed on a holder, for example, on an electrostatic chuck to keep the substrate 301 flat during further processing, described below with respect to FIGS. 3C to 3H.

Figure 3C:
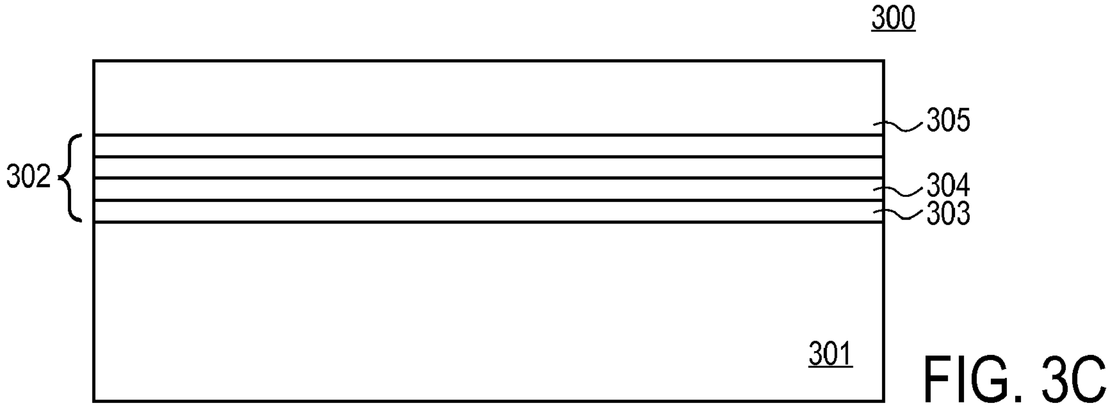
FIG. 3C is a view similar to FIG. 3B, after forming a layer of a photoresist on an optical coating.

FIG. 3C is a view similar to FIG. 3B, after forming a layer 305 of a photoresist on optical coating 302. Layer 305 of the photoresist may be deposited on optical coating 302 by one of techniques known to one of ordinary skill in the art of photolithography, for example, by dispensing the photoresist using spin coating. In one embodiment, the layer 305 of the photoresist is deposited on optical coating 302 having layer 303 of Mo and layer 304 of Si, as described above with respect to FIG. 3B. A material, which is known to one or ordinary skill in the art of photolithography, may be chosen for the photoresist. In one embodiment, a protective layer to protect optical coating 302 from damaging, or a hard mask layer, may be deposited between optical coating 302 and layer 305 of the photoresist, to protect optical coating 302 further in a process.

Figure 3D:
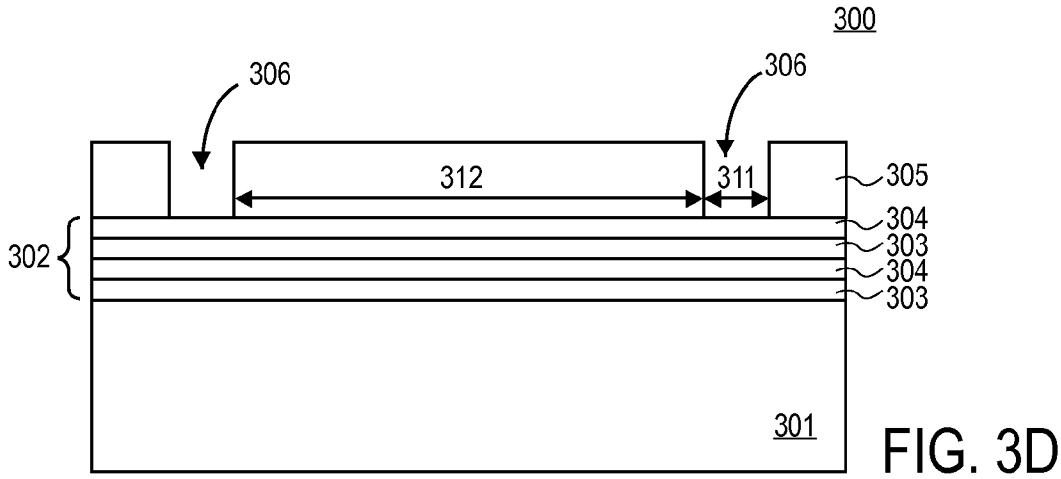
FIG. 3D is a view similar to FIG. 3C, after patterning a layer of a photoresist to form openings.

FIG. 3D is a view similar to FIG. 3C, after patterning the layer 305 of the photoresist to form openings 306 in the photoresist. To draw a pattern in layer 305 of the photoresist, a mask may be formed on the layer 305 using one of techniques known to one of ordinary skill in the art of photolithography. Next, portions of layer 305 of the photoresist may be exposed to an optical beam, e.g., a focused laser beam, or to an electron beam ("e-beam") focused with magnetic and electric fields. In one embodiment, the optical beam to form openings 306 in the photoresist may be formed by the laser having a wavelength of around 250 nm, e.g., KrF excimer laser or third harmonic YAG laser. In one embodiment, the optical beam, or e-beam is moved ("rastered") along a surface of the layer 305 to form openings 306. Moving the focused optical beam or e-beam may be accomplished by a scanning mirror having control over the focusing of the optical beam or e-beam. In another embodiment, the substrate 301 having optical coating 302 and layer 305 of photoresist is moved ("rastered") relative to the optical beam or the e-beam to form openings 306. The rastering step for scanning the optical beam or e-beam, or for moving the substrate 301, and the diameter of the focused optical beam or e-beam are determined by a desired spacing between openings 306 and by a desired size of the openings 306. For example, to form openings 306 having a size of 100 microns ("um"), the diameter of the focused optical beam or e-beam may be not more than 100 um, and the step for moving the optical beam, e-beam, or substrate 301 may be not more than 1 mm. Next, the exposed portions of the layer 305 may be developed, and then removed to form openings 306. Developing and then removing the exposed portions of layer 305 of the photoresist may be performed using one of techniques known to one of ordinary skill in the art of photolithography. Width 311 of openings 306 and spacing 312 between openings 306 determine the width and the spacing between openings in optical coating 302 formed later on in the process.

Figure 3E:
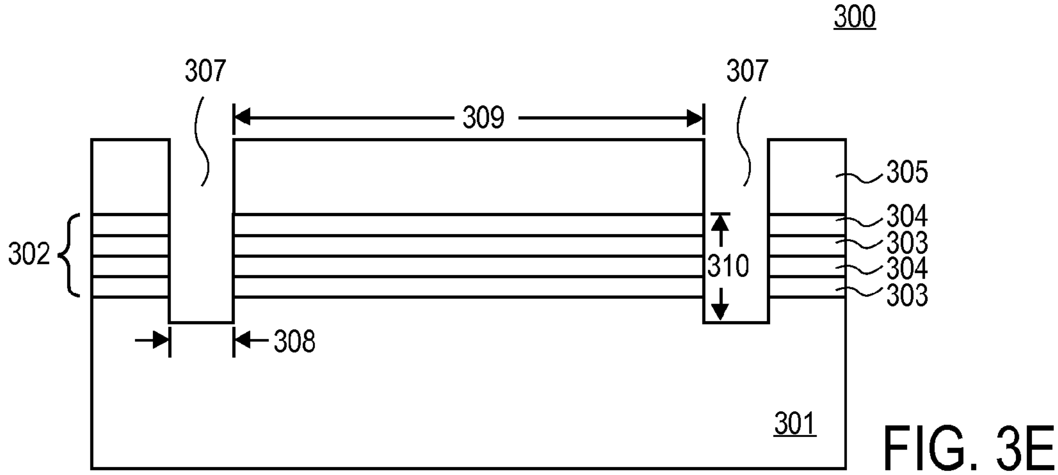
FIG. 3E is a view similar to FIG. 3D, after openings in an optical coating are formed.

FIG. 3E is a view similar to FIG. 3D, after openings 307 in optical coating 302 are formed. In one embodiment, the openings 307 in optical coating 302 may be formed by etching optical coating 302 down to substrate 301 through the openings 306 in the photoresist. The etching may be dry etching, wet etching, or a combination thereof, depending on a desired dimensions and shape of openings 307. For example, to maintain vertical sidewalls of openings 307, the dry etching, e.g., a halogen based reactive ion etch, may be performed. To produce sloped sidewalls of the openings 307, the wet etching, e.g., an electromechanical KOH etching, may be performed. In one embodiment, the openings 307 in optical coating 302 having layer 303 of Mo and layer 304 of Si are trenches formed along a grid. The trenches in optical coating 302 have a width 308, a depth 310 and a spacing 309 between the trenches, as shown in FIG. 3E. The openings 307 may be etched through optical coating 302 into substrate 301, as shown in FIG. 3E. In one embodiment, each of the trenches formed along the grid in the multiplayer mirror of Mo and Si on the substrate 301 has the width 308 in the approximate range of 50 um and 200 um, the spacing 309 between the trenches is in the approximate range of 0.5 mm to 2 mm, and the depth 310, may be at least greater than the thickness of the optical coating 302, for example, down to 1 micron. More specifically, the width 308 of each of the trenches produced in a multiplayer mirror coating on the substrate 301 may be around 100 um and the spacing 309 between the trenches may be around 1 mm.

Figure 3F:
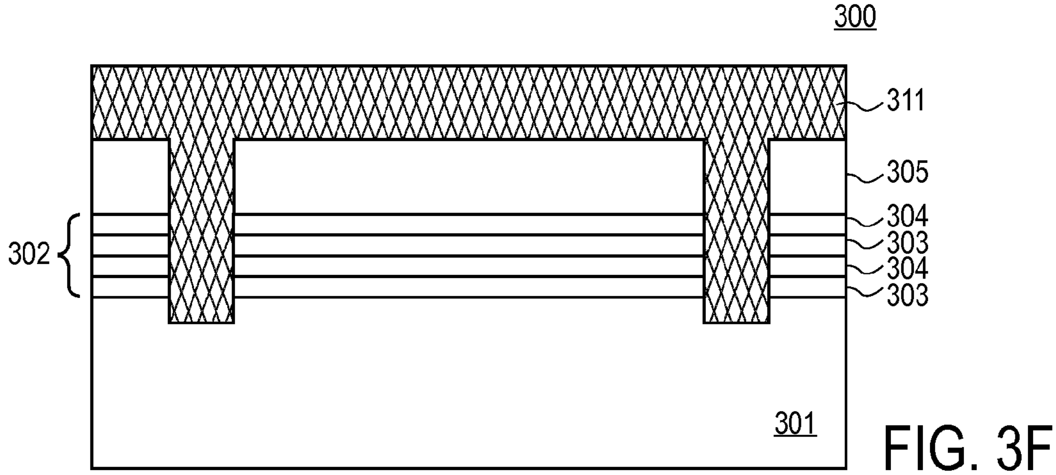
FIG. 3F is a view similar to FIG. 3E, after a gettering agent is formed in openings in an optical coating.

FIG. 3F is a view similar to FIG. 3E, after a gettering agent 311 is formed on layer 305 of the photoresist filling openings 307. The gettering agent 311 may be formed in the openings 307 by spin coating, electroplating, or using any other technique known to one of ordinary skill in the art of optics fabrication. The choice of a gettering agent 311 may depend on a contaminating material to be removed from the optics.

The contaminant material tends to preferably diffuse to the gettering agent 311 thereby moving away from the surface of the optics. In one embodiment, gettering agent 311 may contain carbon ("C"), copper ("Cu"), nickel ("Ni"), or any combination thereof. For example, when lithium ("Li") is used as a fuel for EUV photons, gettering agent 311 may be carbon. Carbon containing solvent may be spin coated over the layer 305 of the photoresist filling the openings 307, as shown in FIG. 3F. Carbon containing solvents may be formed using one of techniques known to one of ordinary skill in the art of optics fabrication. Next, the optical element may be heated to evaporate the solvent while leaving the carbon in the openings 307 and on layer 305 of the photoresist. In one embodiment, a carbon containing polymer, e.g., a photoresist, may be used as gettering agent 311.

In another embodiment, when Sn is used as a fuel for EUV photons, gettering agent 311 may be copper, or nickel. Cu or Ni may be deposited into openings 307 by one of electroplating techniques known to one of ordinary skill in the art of semiconductor manufacturing. For example, Cu may be deposited into the openings 307 by placing substrate 301 with optical coating 302 as a cathode in a solution of CuSO4 in H2SO4 and H20. For one embodiment, Cu or Ni may be deposited into openings 307 after photoresist 305 is removed.

Figure 3G:
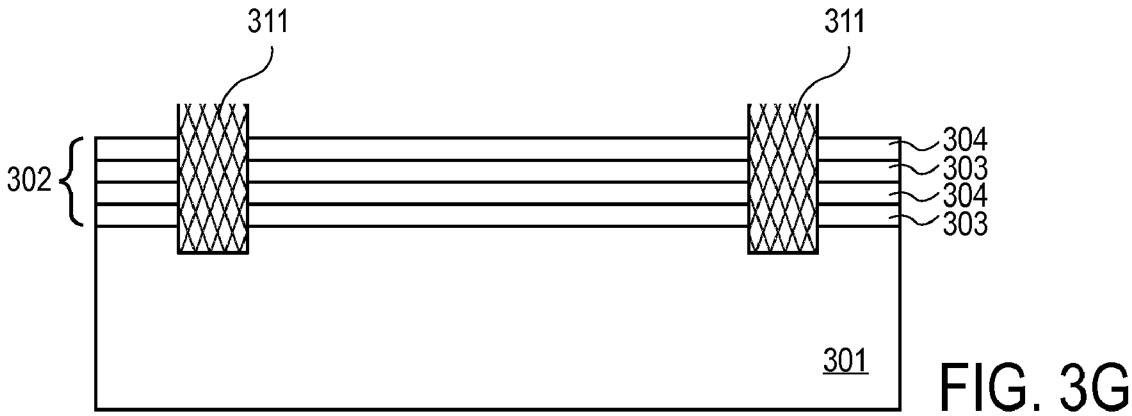
FIG. 3G is a view similar to FIG. 3F, after a layer of the photoresist is removed.

FIG. 3G is a view similar to FIG. 3F, after layer 305 of the photoresist is removed ("lifted off"). As shown in FIG. 3G, gettering agent 311 fills openings in optical coating 302 having alternating layers 303 and 303 on substrate 301. In one embodiment, layer 305 of the photoresist with gettering agent 311 deposited on the photoresist may be selectively etched away while preserving optical coating 302 and gettering agent 311 filling the openings in the optical coating 302. Layer 305 may be removed by wet etching of an organic material of the layer 305 while leaving a metallic material of optical coating 302 intact using one of the chemistries known to one of ordinary skill in the art of optics fabrication. For example, layer 305 of the photoresist may be removed ("ashed away") in oxygen plasma followed by an argon plasma sputter etch for a short time, e.g., less than 1 minute to remove surface oxide from optical coating 302. In one embodiment, a layer of SiN may be deposited on top of optical coating 302 having alternating layers of Mo and Si to further protect optical coating 302 from etching. In another embodiment, layer 305 of the photoresist with a portion of the gettering agent 311 above the photoresist may be removed ("lifted off") by dissolving in a suitable solvent, e.g. in propylene glycol monomethyl ether acetate ("PGMEA"). In an embodiment, Layer 305 may be removed from optical coating 302 by chemical-mechanical polishing ("CMP").

In one embodiment, gettering agent 311 may be deposited into openings 307 in optical coating 302 after layer 305 of a photoresist is removed. In one embodiment, gettering agent 311 may be selectively formed in openings 307 in optical coating 302, leaving a top surface of optical coating 302 intact. In one embodiment, a protective layer to protect optical coating 302 from damaging, or hard mask layer, may be formed on the top surface of optical coating 302, before forming gettering agent 3011 in the openings 307, to protect the top surface of optical coating 302 from contamination by gettering agent 307.

Figure 3H:
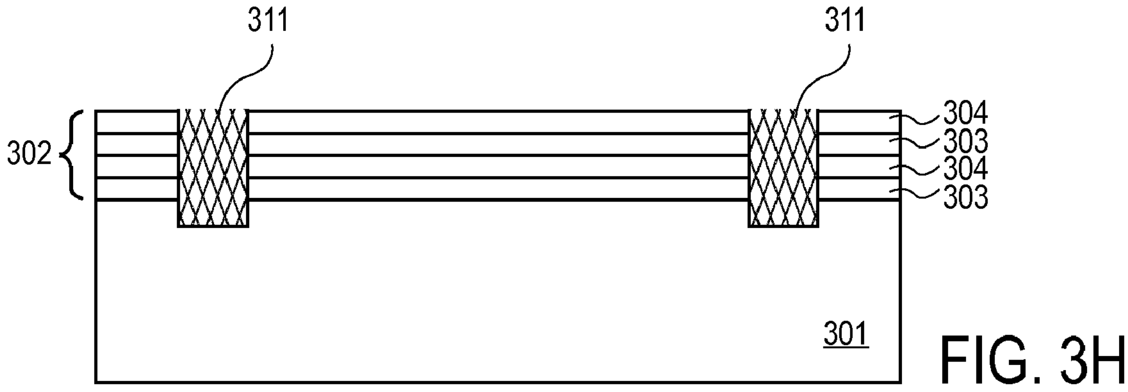
FIG. 3H is a view similar to FIG. 3G, after a top surface of the optical coating including a gettering agent is polished according to another embodiment of the invention.

FIG. 3H is a view similar to FIG. 3G, after a top surface of the optical coating including gettering agent 311 is planarized according to another embodiment of the invention. In one embodiment, the top surface of the optical coating including gettering agent 311 is planarized by polishing using one of techniques known to one of ordinary skill in the art of optics fabrication. In one embodiment, a top surface of the optical coating 302 with gettering agent 311 may be smoothed by CMP to reduce losses of the reflected light.

Figure 4A:
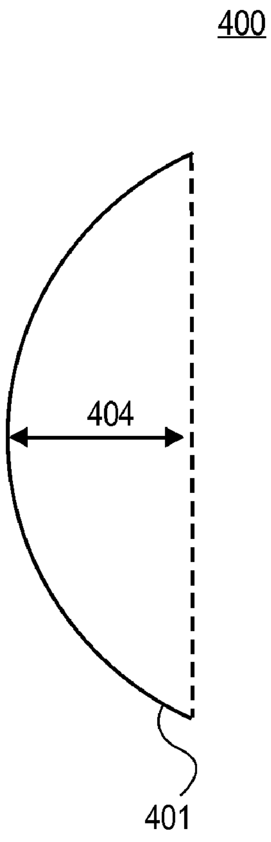
FIGS. 4A and 4B show a side view and a top view respectively of an optical element according to one embodiment of the invention.
Figure 4B:
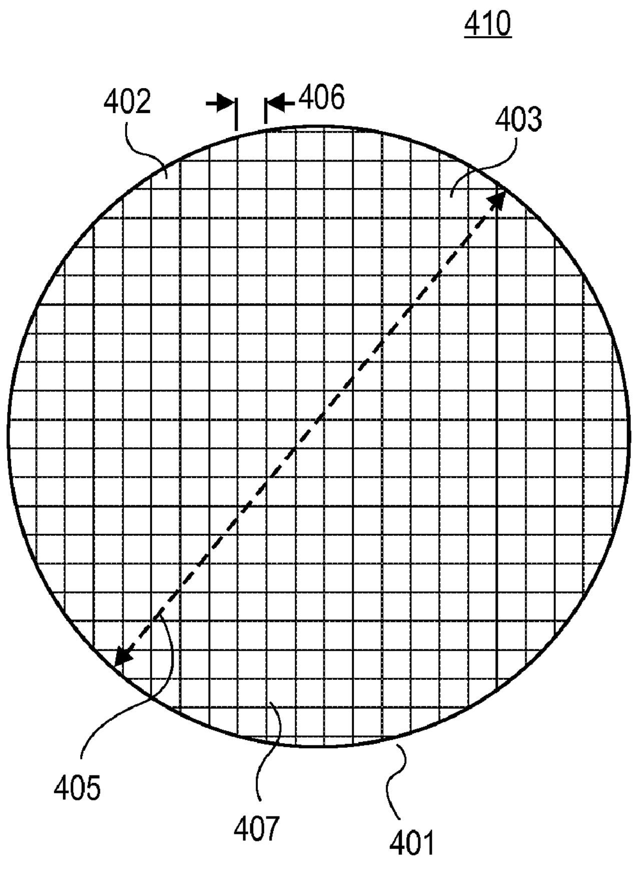

FIGS. 4A and 4B show a side view 400 and a top view 410 of optical element 401 according to one embodiment of the invention. As shown in FIGS. 4A and 4B, optical element 401 is covered by optical coating 402 with a grid of trenches 403 filled with a gettering agent using methods and materials described above with respect to FIGS. 3A-3H. As shown in FIGS. 4A and 4B, optical element 401 has a concave shape with a curvature 404 and a diameter 405. Trenches 403 are separated from each other by distance 406. In one embodiment, the width, the depth, and the distance 406 between the trenches 403 are such to provide maximum reflectivity for the mirror surface of the optical coating 402 while substantially removing all contaminants from the optical coating 402. In one embodiment, curvature 404 of the optical element 401 may be in the approximate range of 50 mm to 500 mm, diameter 405 may be at least 200 mm, distance 406 may be in the approximate range of 0.5 mm to 2 mm, and the width of each of the trenches 403 may be in the approximate range of 50 um to 200 um. More specifically, curvature 404 may be in the approximate range of 100 mm to 200 mm and diameter 405 may be in the approximate range of 250 mm-500 mm, distance 406 may be in the approximate range of 0.5 to 1.5 mm, and the width of each of the trenches may be in the approximate range of 0.5 um to 150 um.

The EUV optics is kept at elevated temperatures above melting point of the contaminant material to decelerate condensation of the contaminants on optical coating of the optical element 401. More specifically, when lithium ("Li") is used as a source fuel, optical element 401 is kept at temperature above 190 C and when tin ("Sn") is used as a fuel, optical element 401 is kept at a temperature above 240 C. At elevated temperatures the atoms and molecules of the contaminant materials are mobile and may diffuse along optical element 401. Trenches 403 filled with a gettering agent produce a large reservoir that attracts atoms and molecules of contaminant materials, such that contaminants are driven away from reflective portions 407 of the optical element 401 into trenches 403. As such, trenches 403 filled with the gettering agent protect the reflective portion of the optics from diffusion of contaminants. Trenches 403 occupy a portion of the reflective area of the optical element 401, such that it does not substantially affect the reflectivity of the optical element 401. More specifically, because of trenches 403, the reflectivity of the optical element 401 may be reduced by not more than 10%.

Figure 5A:
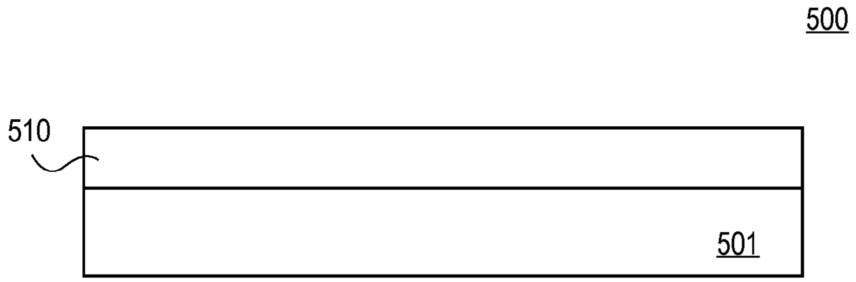
FIG. 5A is a cross-sectional view of a substrate to fabricate an optical element for EUV light having patches of a gettering agent according to another embodiment of the invention.

FIG. 5A is a cross-sectional view 500 of a substrate 501 to fabricate an optical element for EUV light having patches of a gettering agent according to another embodiment of the invention. The substrate 501 may have dimensions, a shape, and materials as described above with respect to FIG. 3A. An optical coating 510 is formed on the substrate 501, as shown in FIG. 5A. In one embodiment, optical coating 510 on substrate 501 is a mirror, which reflects EUV light in the approximate wavelength range of 10 nm to 20 nm with reflectivity at least 65-70%, as described above with respect to FIG. 3B. In an embodiment, optical coating 510 may include a metal, silicon, or any combination thereof. In one embodiment, optical coating 510 includes alternating layers of two materials, for example a layer of Mo and a layer of Si, as described above with respect to FIG. 3B.

Figure 5B:
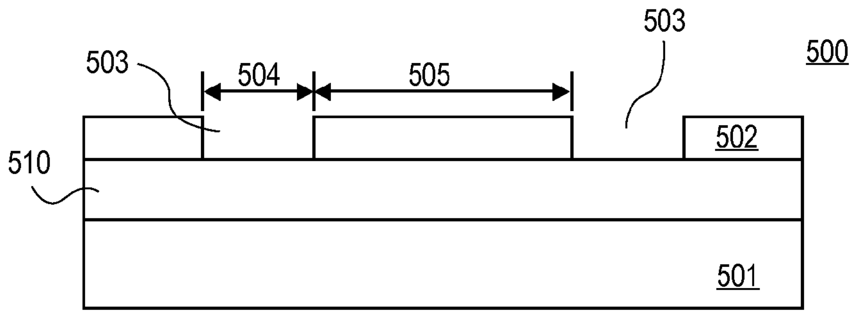
FIG. 5B is a view similar to FIG. 5A, after patterning a substrate.

FIG. 5B is a view similar to FIG. 5A, after patterning substrate 501 to define areas for patches of the gettering agent, which are formed later on in the process. In one embodiment, to pattern substrate 501, a layer 502 is deposited on optical coating 510 over substrate 501. In one embodiment, layer 502 is a layer of a photoresist deposited over substrate 501 using one of techniques known to one of ordinary skill in the art of photolithography for example, by spin coating. To draw a pattern in a layer 502, a mask may be formed on the layer 502 using one of techniques and materials known to one of ordinary skill in the art of optics fabrication.

Next, portions of layer 502 of the photoresist may be exposed to an optical beam, or to an e-beam to draw a pattern in the photoresist, as described above with respect to FIG. 3D. Next, the exposed portions of the layer 502 are developed, and then removed to form openings 503. Developing and then removing the exposed portions of layer 502 of the photoresist may be performed using one of techniques known to one of ordinary skill in the art of photolithography. Width 504, length (not shown) of openings 503 and spacing 505 between openings 503 determine the size and the spacing between patches of the gettering agent formed on the substrate 501 later on in the process.

Figure 5C:
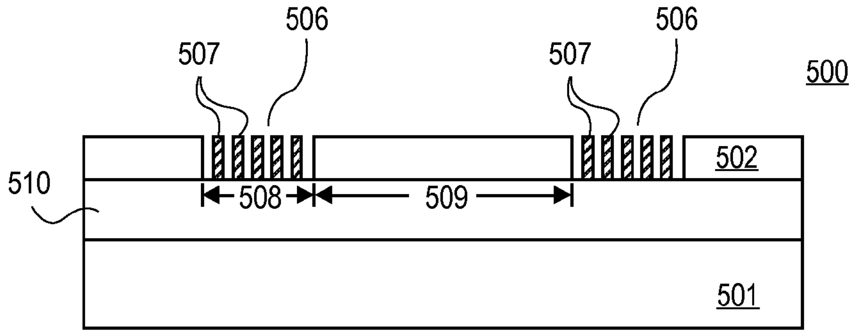
FIG. 5C is a view similar to FIG. 5B, after patches are formed in areas defined by patterning.

FIG. 5C is a view similar to FIG. 5B, after patches 506 of the gettering agent are formed on optical coating 510 on substrate 501 in areas defined by patterning. In one embodiment, patches 506 of the gettering agent are nanotubes 507 which constitute a nanotube forest. The nanotubes 507 are grown using a gettering agent as a seed. In one embodiment, nanotubes 507 may be grown in a furnace with a gettering agent, e.g., carbon, as a seed, independent of substrate 501 and then transferred to substrate 501. As shown in FIG. 5B, nanotubes 507 are macromolecules having a shape of thin, hair-like cylinders that rise or lie on a surface of the substrate. In another embodiment, patches 506 may contain carbon black, which is a powdered form of highly dispersed elemental carbon. Carbon black is typically used as a reinforcing agent in rubber products such as tires, tubes, conveyer belts, and the like, or as a black pigment in printing, lithography, coatings, and the like. The carbon black is typically fabricated by vapour-phase pyrolysis of hydrocarbons. The carbon black then is deposited to designated areas of substrate 501, for example, by spin coating, using one of techniques known in the art of lithography.

Patches 506 of the gettering agent attract molecules and atoms of contaminant materials acting as sponges for contaminants, as described above with respect to FIGS. 1-4. Because nanotubes 507 are anisotropic, contaminants may diffuse along the nanotubes much faster than across optical coating 510 thereby clearing the optical surface. In one embodiment, the patches 506 containing carbon, act as sponges for Li clearing the surface of the optics. In one embodiment, patches 506 over substrate 501 have the width 508 in the approximate range of 5 um to 20 um and the length (not shown) in the approximate range of 5 um to 20 um. More specifically, patches 506 may have a size of 10 um×10 um. The distance 509 between patches 506 is such that optical interference of the light from an optical surface is minimized.

Figure 5D:
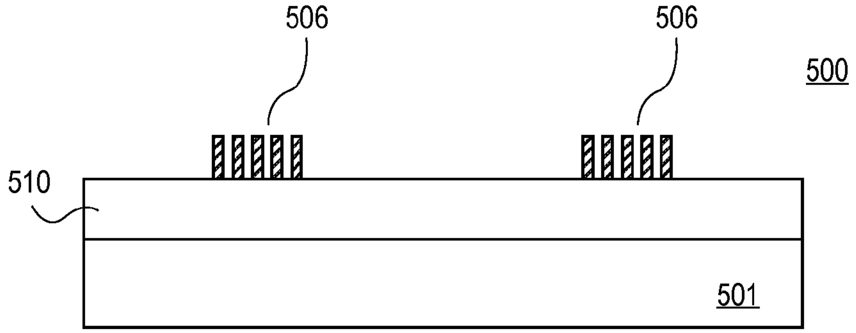
FIG. 5D is a view similar to FIG. 5C, after a layer of a photoresist is removed.

FIG. 5D is a view similar to FIG. 5C, after layer 502 of the photoresist is removed from optical coating 510. In one embodiment, layer 502 of the photoresist may be removed by selectively etching the photoresist while preserving patches 506 and optical coating 510. In an embodiment, layer 502 may be removed using techniques and chemicals described above with respect to FIG. 3G. In one embodiment, excess portions of patches 506 may be removed by chemical-mechanical polishing while leaving optical coating 510 intact.

Figure 6A:
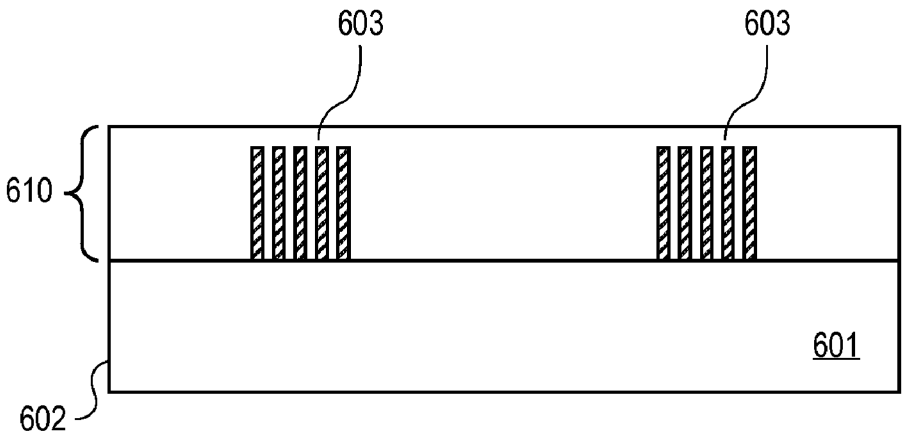
FIG. 6A is a side view of an optical element, wherein optical coating is deposited over patches of a gettering agent on a substrate according yet to another embodiment of the invention.

FIG. 6A is a side view 600 of an optical element 602, wherein optical coating 610 is deposited after patches 603 of a gettering agent are formed on substrate 601 according yet to another embodiment of the invention. Patches 603 of the gettering agent, e.g. carbon, are formed on the substrate 601 using techniques described above with respect to FIG. 5C. Next, optical coating 610 is deposited on the substrate 601 over patches 603. Materials, dimensions of optical coating 610, and techniques to deposit the optical coating 610 are described above with respect to FIGS. 3B and 5A.

Figure 6B:
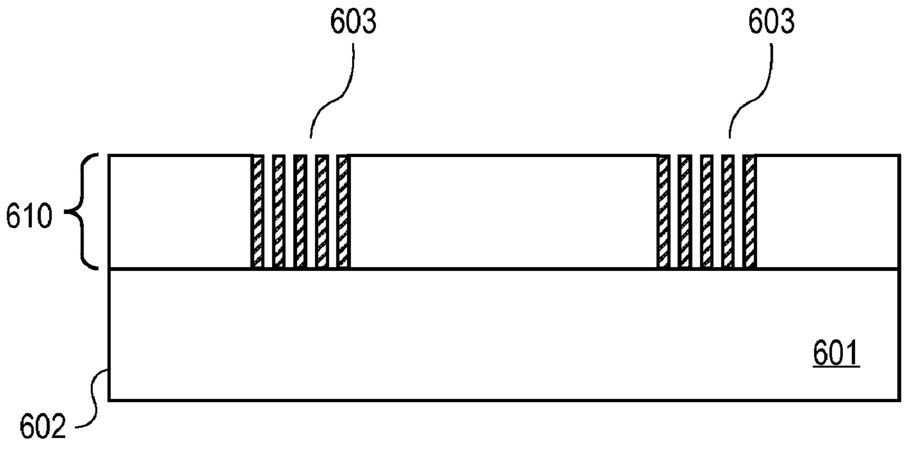
FIG. 6B is a view similar to FIG. 6A, after portions of an optical coating are removed exposing patches.

FIG. 6B is a view similar to FIG. 6A, after portions of optical coating 610 are removed exposing patches 603. As shown in FIG. 6B, patches 603 of the gettering agent, for example, a carbon nanotube forest, or carbon black, are formed on substrate 601. Optical coating 610 covers substrate 601 between patches 603, as shown in FIG. 6B. The excess portion of optical coating 610 may be removed by etching for a predetermined amount of time to expose patches 603 of the nanotube forest or a carbon black. In one embodiment, the portions of optical coating 610 to expose patches 603 may be removed by wet etching, dry etching, or a combination thereof using one of techniques known in the art of optics fabrication.

Figure 7:
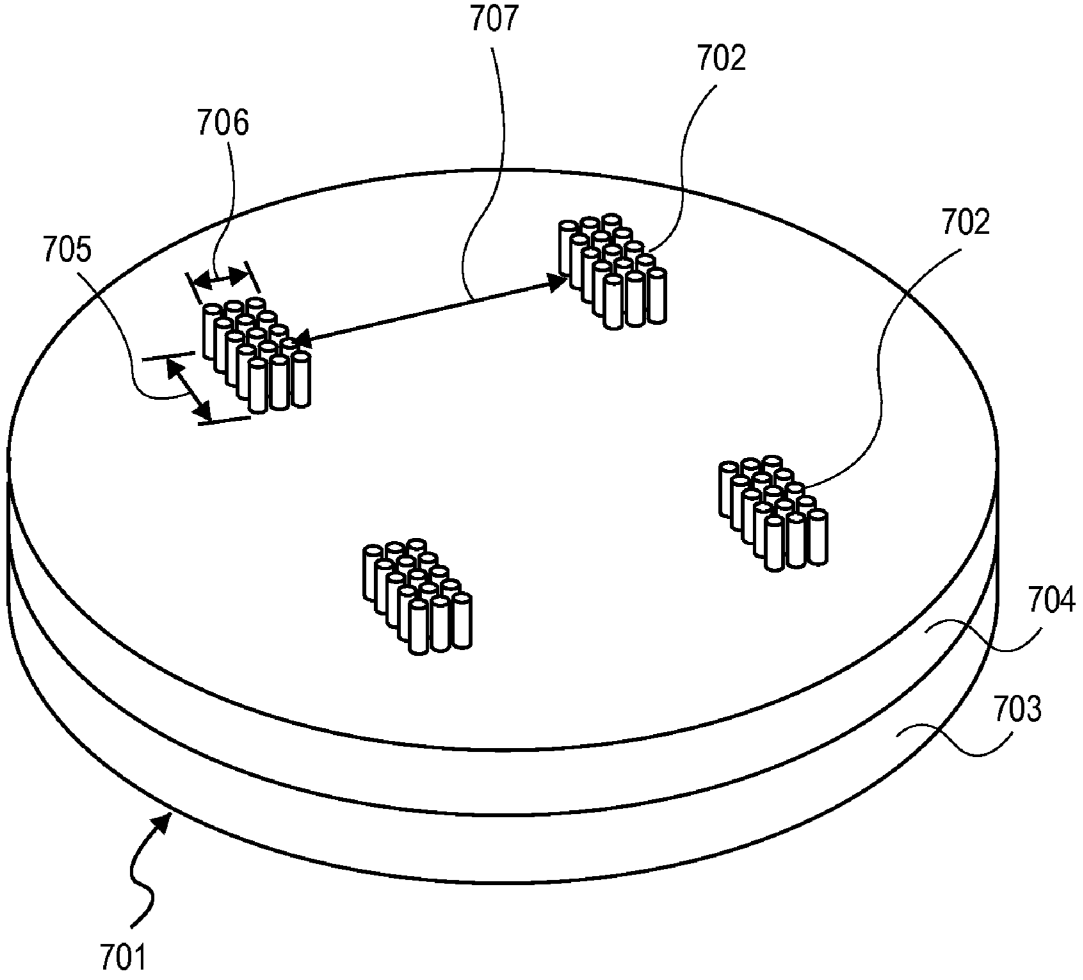
FIG. 7 is a perspective view of an optical element having patches of a gettering agent according to another embodiment of the invention.

FIG. 7 is a perspective view 700 of optical element 701 with patches 702 of a gettering agent on an optical coating 704 on substrate 703 according to another embodiment of the invention. The optical substrate 703 may be made of materials and may have dimensions as described above with respect to FIG. 5A. As shown in FIG. 7, the optical coating 704 on substrate 703 surrounds patches 702 of the gettering agent. In one embodiment, optical coating 704 includes alternating layers of Mo and Si as described above with respect to FIGS. 3B and 5A. In one embodiment, the gettering agent in patches 702 is a carbon nanotube forest, carbon black, or a combination thereof.

As shown in FIG. 7, patches 702 have width 705 and length 706. Width 705, length 706, and distance 707 between of patches 702 are such to preserve maximum reflectivity of the light from the surface of the optical coating 704 while clearing the surface of the optical coating 704 from contaminants. In one embodiment, patches 702 of carbon nanotubes, or carbon black attract atoms and molecules of lithium, such that the contaminants diffuse straight down the access of the nanotubes into the reservoir beneath the surface of the optical coating 704. In one embodiment, for an optical element 701 having a diameter in the approximate range of 100 mm to 500 mm, each of the patches 706 on the multilayer mirror of Mo and Si has width 705 in the approximate range of 5 um to 20 um and length 706 in the approximate range of 5 micron ("um") to 20 um, wherein the distance 707 is in the approximate range of 50 um to 300 um. More specifically, width 705 may be about 10 um, length 706 may be about 10 um, and distance 707 may be about 100 um.

For alternate embodiments, the methods described above may be used to protect various types of elements for variety of applications, from contaminants. The variety of applications may include operation of the element in a range of gamma-rays, x-rays, optical spectrum, microwave, radio waves, or any combination of ranges thereof. Various modifications may be made to exemplary embodiments described in foregoing specification without departing from the broader spirit and scope of the invention as set forth in the following claims.

What is claimed is:

1. An apparatus, comprising:

trenches in an optical coating on a substrate; and a gettering agent in the trenches, wherein the optical coating includes alternating layers of molybdenum and silicon.

2. The apparatus of claim 1, wherein a width of the trenches is between 50 μm to 200 μm.

3. The apparatus of claim 1, wherein a spacing between each of the trenches is between 0.5 mm to 2 mm.

4. An apparatus, comprising:

trenches in an optical coating on a substrate; and a gettering agent in the trenches, wherein the gettering agent is carbon.

5. An apparatus, comprising:

patches of a gettering agent on a substrate; and an optical coating on the substrate between the patches of the gettering agent, wherein the gettering agent is a plurality of carbon nanotubes.

6. The apparatus claim 5, wherein the patches have a width between 5 μm to 20 μm and a length between 5 μm and 20 μm.

7. An apparatus, comprising:

patches of a gettering agent on a substrate; and an optical coating on the substrate between the patches of the gettering agent, wherein the optical coating includes alternating layers of molybdenum and silicon.

8. An apparatus, comprising:

patches of a gettering agent on a substrate; and an optical coating on the substrate between the patches of the gettering agent.

* * * * *

UNITED STATES PATENT AND TRADEMARK OFFICE

CERTIFICATE OF CORRECTION

PATENT NO. : 7,825,424 B2
APPLICATION NO. : 12/002152
DATED : November 2, 2010
INVENTOR(S) : Bristol et al.

It is certified that error appears in the above-identified patent and that said Letters Patent is hereby corrected as shown below:

In column 10, at line 62 delete, “agent.” and insert --agent, wherein the gettering agent is carbon black--.

Signed and Sealed this
Third Day of May, 2011

David J. Kappos
*Director of the United States Patent and Trademark Office*